(12) United States Patent
Miya et al.

(10) Patent No.: US 7,981,815 B2
(45) Date of Patent: Jul. 19, 2011

(54) SEMICONDUCTOR DEVICE PRODUCING METHOD AND SUBSTRATE PROCESSING APPARATUS

(75) Inventors: Hironobu Miya, Toyama (JP);
Kazuhiro Hirahara, Joetsu (JP);
Yoshitaka Hamada, Joetsu (JP);
Atsuhiko Suda, Toyama (JP)

(73) Assignees: Hitachi Kokusai Electric Inc., Tokyo (JP); Shin-Etsu Chemical Co., Ltd., Tokyo (JP)

( * ) Notice: Subject to any disclaimer, the term of this patent is extended or adjusted under 35 U.S.C. 154(b) by 192 days.

(21) Appl. No.: 12/087,779

(22) PCT Filed: Jul. 19, 2007

(86) PCT No.: PCT/JP2007/064236
§ 371 (c)(1),
(2), (4) Date: Jul. 15, 2008

(87) PCT Pub. No.: WO2008/010546
PCT Pub. Date: Jan. 24, 2008

(65) Prior Publication Data
US 2009/0053906 A1 Feb. 26, 2009

(30) Foreign Application Priority Data
Jul. 20, 2006 (JP) .................................. 2006-198753

(51) Int. Cl.
*H01L 21/31* (2006.01)
(52) U.S. Cl. .. 438/788; 438/216; 438/261; 257/E21.278
(58) Field of Classification Search .................. 438/216, 438/240, 261, 778, 788; 257/E21.278
See application file for complete search history.

(56) References Cited

U.S. PATENT DOCUMENTS

| | | |
|---|---|---|
| 2002/0098627 A1 | 7/2002 | Pomarede et al. |
| 2003/0168001 A1* | 9/2003 | Sneh .............................. 117/86 |
| 2004/0092132 A1* | 5/2004 | Doan et al. .................... 438/785 |
| 2006/0211223 A1* | 9/2006 | Brcka ............................ 438/493 |
| 2007/0259110 A1* | 11/2007 | Mahajani et al. .......... 427/248.1 |

FOREIGN PATENT DOCUMENTS

| | | |
|---|---|---|
| JP | 2004-523885 A | 8/2004 |
| JP | 2006-161061 A | 6/2006 |
| KR | 2003-0051873 A | 6/2003 |

OTHER PUBLICATIONS

Alam et al., Journal of Applied Physics, vol. 94, No. 5, Sep. 1, 2003, pp. 3403-3413.
Puurunen, Journal of Applied Physics, vol. 95, No. 9, May 1, 2004, pp. 4777-4786.
Korean Office Action issued on Jun. 25, 2010 in corresponding Korean Patent Application No. 10-2008-7018387.
Korean Office Action issued on Nov. 12, 2010 in corresponding Korean Patent Application No. 10-2008-7018387.

* cited by examiner

*Primary Examiner* — Thanhha Pham
(74) *Attorney, Agent, or Firm* — Birch, Stewart, Kolasch & Birch, LLP

(57) ABSTRACT

Disclosed is a producing method or a semiconductor device including: loading at least one substrate into a processing chamber; forming a metal oxide film or a silicon oxide film on a surface of the substrate by repeatedly supplying a metal compound or a silicon compound, each of which is a first material, an oxide material which is a second material including an oxygen atom, and a hydride material which is a third material, into the processing chamber predetermined times; and unloading the substrate from the processing chamber.

23 Claims, 10 Drawing Sheets

First half-reaction

Second half-reaction

SEMICONDUCTOR DEVICE PRODUCING METHOD AND SUBSTRATE PROCESSING APPARATUS

BACKGROUND OF THE INVENTION

1. Field of the Invention

The present invention relates to a forming method of a thin film, a producing method of a semiconductor device and a substrate processing apparatus, and more particularly, to a technique for forming an oxide film on a semiconductor wafer ("wafer", hereinafter) by an ALD (Atomic Layer Deposition) method in a producing method of a semiconductor integrated circuit.

2. Description of the Related Art

In recent years, as the density of a semiconductor DRAM device is enhanced and the number of multi-layered wirings is increased, it is required to form a film at a lower temperature, and a capacitor material having excellent surface flatness, excellent recess embedding properties, excellent step coverage and a high dielectric constant (k) is required. Materials such as $HfO_2$ (k=30) and $ZrO_2$ (k=25) are used as a capacitor material having a higher dielectric constant than the conventional $Si_3N_4$ (k=7). There are a sputtering method, an MOCVD (Metal organic CVD) method and an ALD (Atomic layer deposition) method as an $HfO_2$ film forming method, but the ALD method capable of forming a film at a low temperature and having excellent step coverage recently gains the spotlight, and the development thereof is pursued energetically.

When these materials alternately flow into a reaction chamber to form the $HfO_2$ film, there is a problem that if a pattern wafer having a trench structure is used, the step coverage is deteriorated because a film thickness is reduced at a central portion of the wafer, and coverage of the $HfO_2$ film is deteriorated (called "loading effect") depending upon the number of pattern wafers loaded in one batch. If the supply amount or supply time of a hafnium material is increased, the step coverage and the loading effect can be improved. However, throughput is deteriorated due to the increase in the film forming time, and COO (Cost of ownership: producing cost per one wafer) is increased due to the increase in the cost of material as a result of increased amount of the material consumed.

It is preferable that a metal material used for the ALD film forming method has appropriate chemical stability and high reactivity. It is preferable that organic compound has tertiary alkoxide or secondary alkoxide $(MH_n[OCR^1R^2R^3]_{m-n}$ or $MH_n[NR^4R^5]_{m-n}$ as a ligand: wherein M represents a metal including one of an aluminum atom, a titanium atom, a zirconium atom, a hafnium atom, a tantalum atom, a ruthenium atom, an iridium atom and a silicon atom; m is a stable valence of the metal; n is an integer of 0 to 2 (n is equal to 0 when M represents an atom other than silicon); and $R^1$ to $R^5$ represent an alkyl group which has a carbon number of 1 to 4 and which may have ether binding at an intermediate portion).

Examples of hafnium materials are an Hf organic material such as $Hf(O-tBu)_4$ (Tetra-ter-butoxyhafnium: $Hf[OC(CH_3)_3]_4$), $Hf(MMP)_4$ (Tetrakis (1-methoxy-2-methyl-propoxy) hafnium: $Hf[OC(CH_3)_2CH_2OCH_3]_4$), TDEAHf (Tetrakis(diethylamino)hafnium: $Hf[N(C_2H_5)_2]_4$, TEMAH (Tetrakis(ethylmethylamino)hafnium: $Hf[N(CH_3)(C_2H_5)]_4$) and a chloride material such as $HfCl_4$. In the case of silicon, in addition to the above-described ligand, hydrogen is also a preferred ligand if the number thereof is two or less. As an oxidant, ozone $(O_3)$ or plasma-excited oxygen is used.

Also when a $SiO_2$ film is formed by the ALD film forming method like the $HfO_2$ film, a chloride material such as $SiCl_4$ or a Si organic material such as $Si(MMP)_4$ (Tetrakis (1-methoxy-2-methyl-propoxy) silicon: $Si[OC(CH_3)_2CH_2OCH_3]_4$) or TDMAS (Tris (ethylmethylamino) silicon: $SiH[N(CH_3)_2]_3$) is used as a silicon material, but like the $HfO_2$ film, there are a problem that the step coverage at the trench portion is poor and a problem with the loading effect.

SUMMARY OF THE INVENTION

It is, therefore, a main object of the present invention to provide a film forming method of a metal oxide, a producing method of a semiconductor device and a substrate processing apparatus in which the above-described problems of the step coverage and the loading effect in film forming of a metal oxide are solved, a metal compound is adsorbed on a wafer (step) surface at a low temperature in a short time, surface flatness and the step coverage (recess embedding properties) are excellent and there is no loading effect.

According to one aspect of the present invention, there is provided a producing method of a semiconductor device including: loading at least one substrate into a processing chamber; forming a metal oxide film or a silicon oxide film on a surface of the substrate by repeatedly supplying a metal compound or a silicon compound, each of which is a first material, an oxide material which is a second material including an oxygen atom, and a hydride material which is a third material, into the processing chamber predetermined times; and unloading the substrate from the processing chamber.

According to another aspect of the present invention, there is provided a substrate processing apparatus including: a processing chamber to process at least one substrate; a first supply system to supply the processing chamber with a metal compound or a silicon compound, each of which is a first material; a second supply system to supply the processing chamber with an oxide material which is a second material including an oxygen atom; a third supply system to supply the processing chamber with a hydride material which is a third material; an exhaust system to exhaust an atmosphere in the processing chamber; and a control section to control the first supply system, the second supply system and the third supply system so that the first material, the second material and the third material are repeatedly supplied into the processing chamber predetermined times.

DESCRIPTION OF THE PREFERRED EMBODIMENTS

Preferred embodiments of the present invention will be explained with reference to the drawings.

First, adsorption of a material onto a substrate when an $HfO_2$ film is formed will be considered.

M. A. Alam and M. L. Green show that an $HfO_2$ film forming speed in a reaction system of $HfCl_4$ and $H_2O$ is expressed by the following equations (1) and (2) (Journal of Applied Physics, vol. 94, 2003):

$$dN_{HfO}/dC = K_{COV}N_{OH} \qquad \text{Equation (1)}$$

$$dN_{OH}/dC = K_2(N_0 - N_{SiOH}) + (\alpha_{COV} - 1)K_{COV}N_{OH} \qquad \text{Equation (2)}$$

Here, $N_{HfO}$ indicates total volume of the $HfO_2$ film deposited per a unit area after the ALD reaction, C indicates the number of cycles of the ALD, $K_{COV}$ indicates the number of hydroxyl groups (—OH) which react with $HfCl_4$, $N_{OH}$ indicates a surface density of the hydroxyl group, and $K_2$ indicates a speed constant of the hydroxyl group which is newly coupled to Si.

Figure 1A:
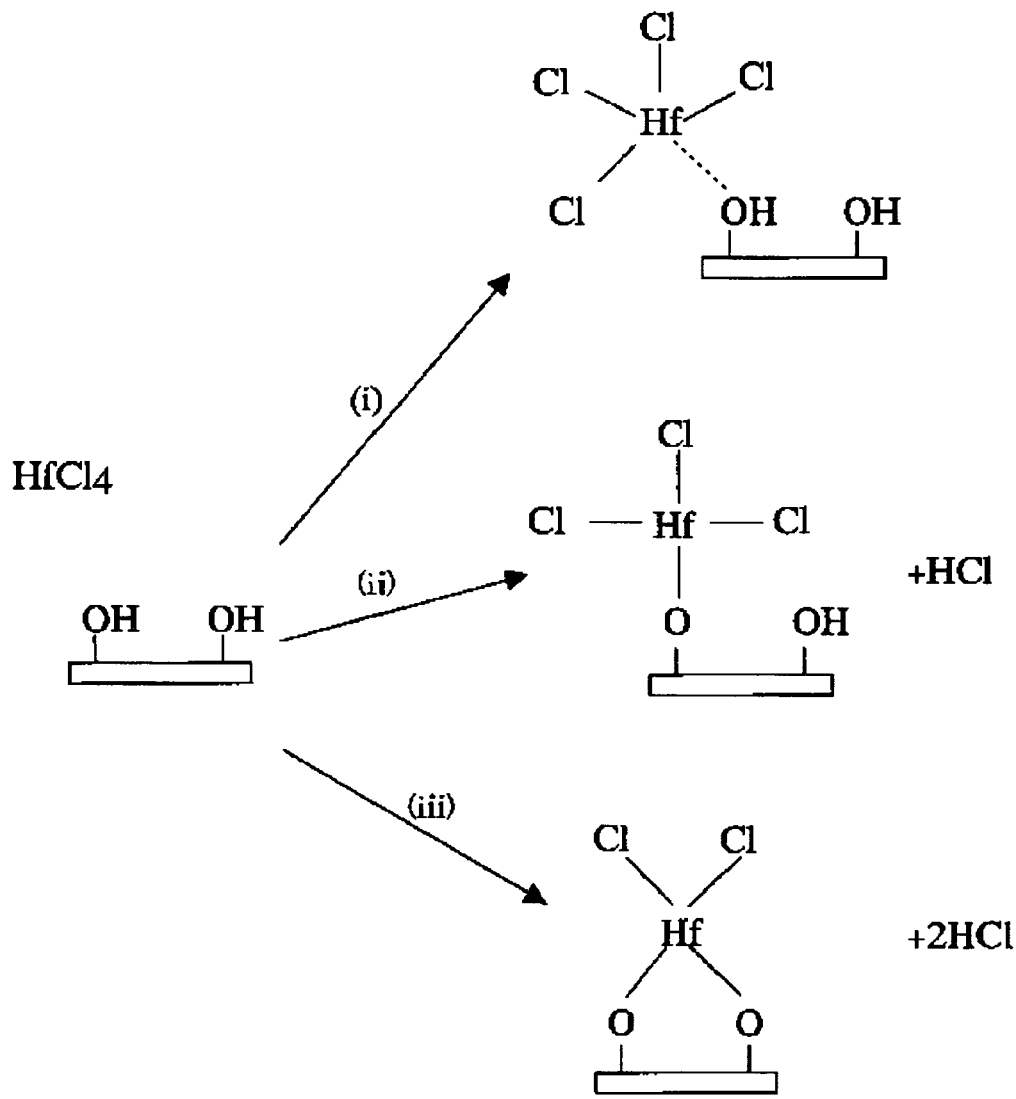
FIG. 1A is a schematic diagram for explaining a film formation mechanism, and schematically shows a process that a Cl-group of $HfCl_4$ reacts with an OH-group on a substrate.
Figure 1B:
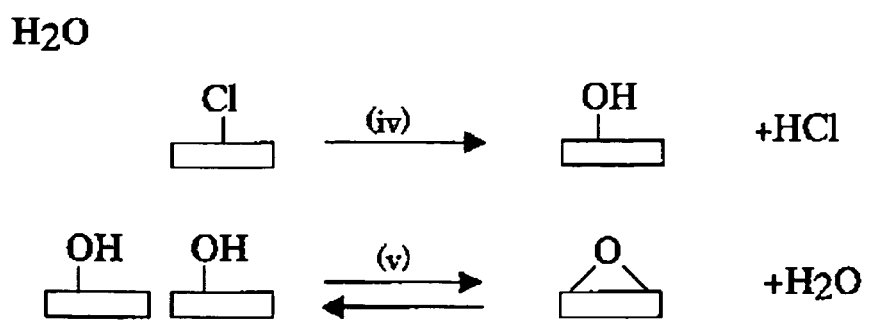
FIG. 1B is a schematic diagram for explaining a film formation mechanism, and schematically shows a process that OH is substituted for Cl of HfClx.

As shown in FIGS. 1A and 1B, R. L. Puurunen (Journal of Applied Physics, vol. 95, 2004) proposes a model in which Cl-groups of $HfCl_4$ react with OH-groups on a substrate in First Half-reaction so that HfClx is adsorbed, and OH is substituted for Cl of HfClx in Second Half-reaction. It is conceived that the adsorption reaction proceeds if an OH-group exists on a substrate.

However, if $H_2O$ is used as an oxidant, $H_2O$ adheres to a wall of a reaction chamber and $H_2O$ cannot easily be exhausted from the reaction chamber. It is reported that only 20% of OH is eliminated only by evacuation when a temperature in the reaction chamber is 50° C., and only 50% of OH is eliminated only by evacuation when the temperature in the reaction chamber is 175° C., and 15% of OH remains even if the evacuation is carried out for 12 hours. As described above, it is difficult to eliminate $H_2O$ from a reaction chamber.

In the preferred embodiments of the present invention, in order to eliminate an influence of $H_2O$ remaining when $H_2O$ is excessively supplied into a reaction chamber, a surface of a substrate is made into OH by atomic hydrogen (hydrogen plasma) and $O_3$ without using $H_2O$.

A surface of a substrate when a film is formed by an ALD method is hydrogen-terminated by HF processing and is inert. Research on a hydrogen-terminated surface has been pursued energetically from the late 1980s to 1990s. The research on XPS by Chabal et al. at AT&T shows that most of dangling bond on a Si surface etched by 1% HF is hydrogen-terminated and chemically stabilized. However, an organic material such as $Hf(NMeEt)_4$ or $Si(NMeEt)_3$ is not easily adsorbed on a H-terminated substrate surface having no polarity. If $H_2O$ flows, the substrate surface is OH-terminated, and the substrate surface has polarity and the material is easily adsorbed.

In order to examine a formation process of a silicon oxide, a film formation model will be explained below by taking TDMAS (Tris (dimethylamino) silane: $SiH[N(CH_3)_2]_3$) as an example.

Figure 2:
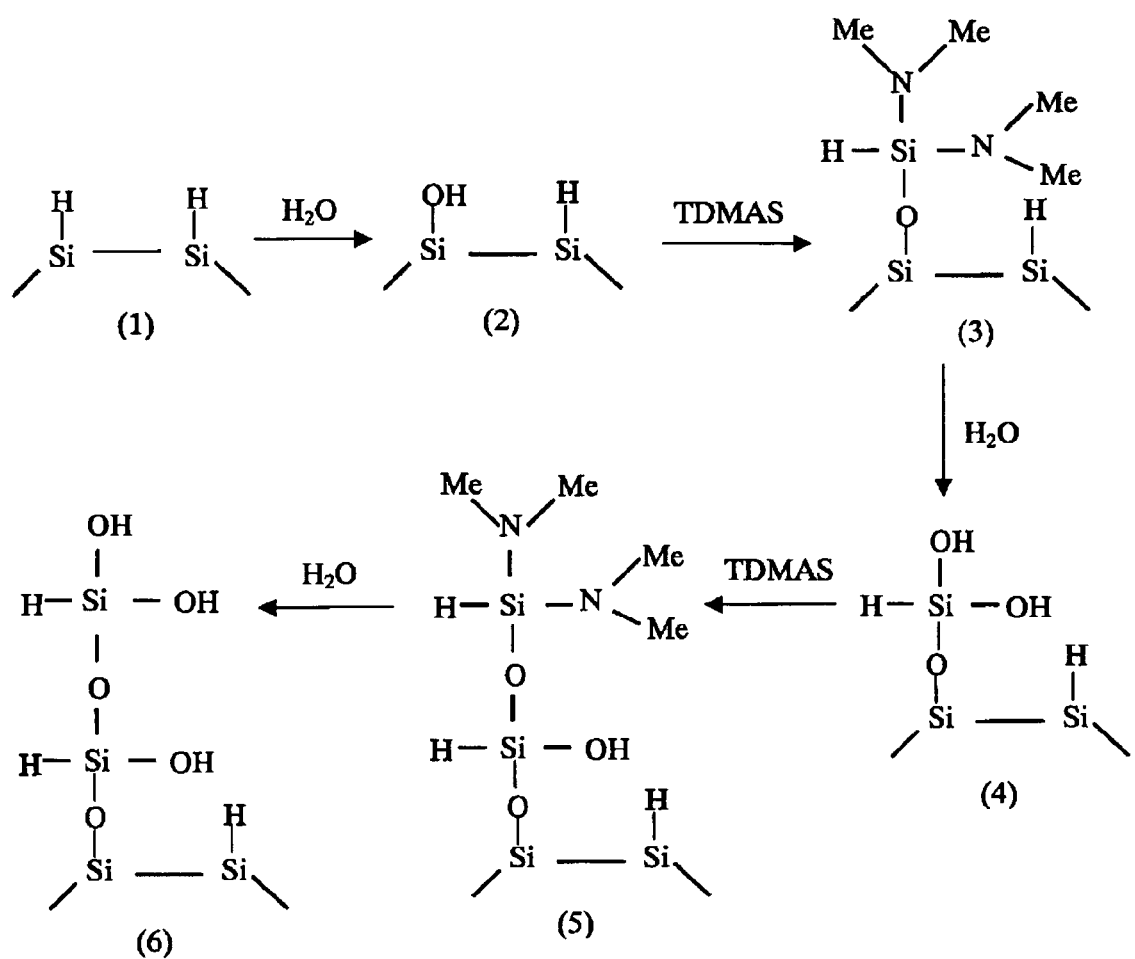
FIG. 2 is a schematic diagram for explaining a film formation mechanism.

FIG. 2 shows a film formation model using TDMAS and $H_2O$. The $H_2O$ molecule is dissociated to form two dangling bonds per molecule. One is Si—OH and the other is Si—H. In a TDMAS supply step, TDMAS is adsorbed on Si—OH site and $N(Me)_2$ is eliminated. In the next $H_2O$ supply step, OH is substituted for $N(Me)_2$ of the adsorbed TDMAS molecule.

Figure 3:
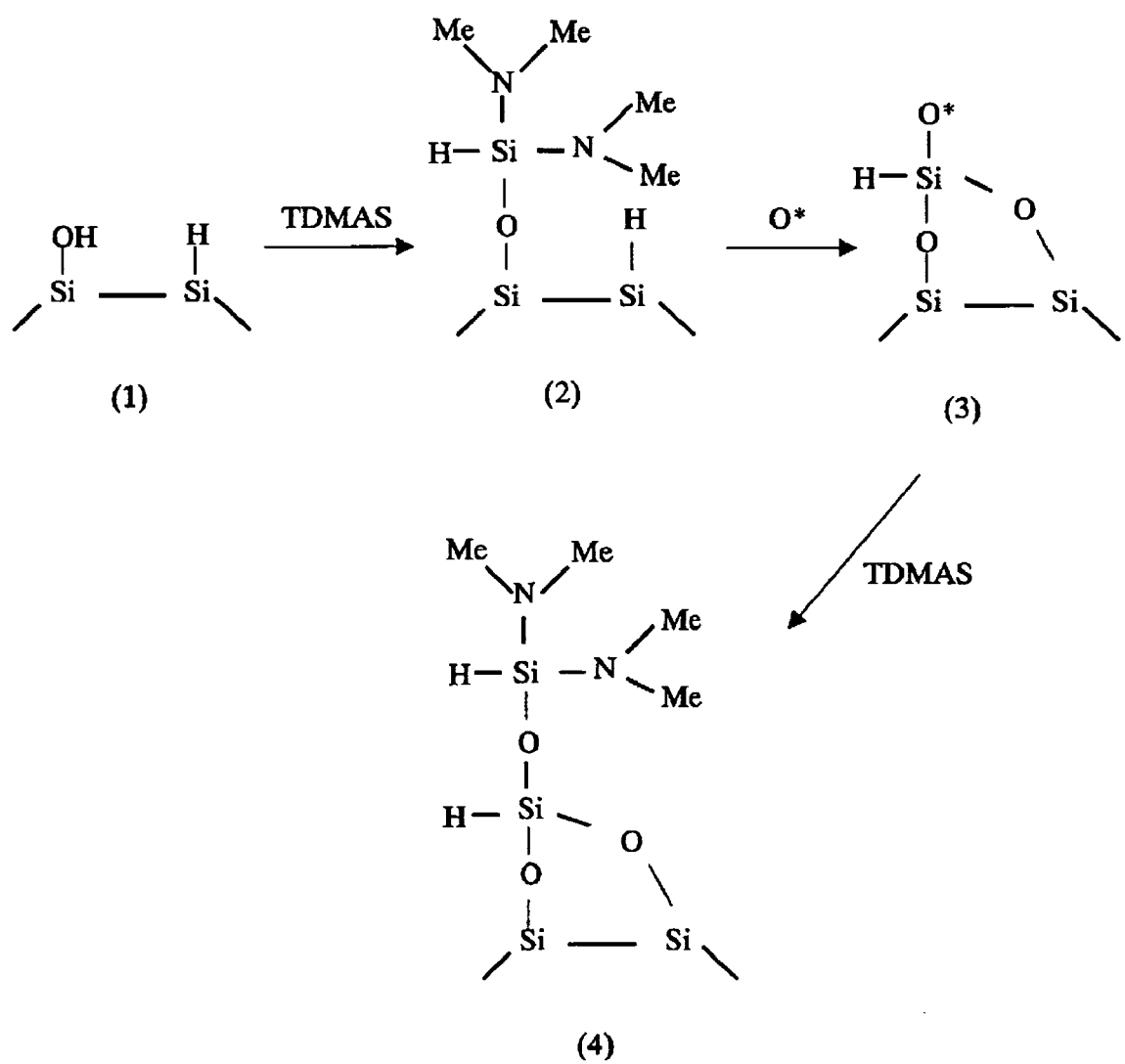
FIG. 3 is a schematic diagram for explaining a film formation mechanism.

FIG. 3 shows a film formation model using TDMAS and $O_3$. A Si surface of a substrate at an initial stage in the film formation is Si—H and Si—OH as is the case with (2) of FIG. 2. In a TDMAS supply step, TDMAS is adsorbed on the Si—OH site and $N(Me)_2$ is eliminated. Activated oxygen atom O* eliminates $N(Me)_2$ groups of TDMAS molecule adsorbed on the surface of the substrate. At the same time, at locations where the $N(Me)_2$ groups are eliminated, Si—O—Si coupling is formed or a dangling bond remains. Next, when TDMAS is supplied into the reaction chamber, TDMAS is adsorbed on the dangling bond portion and a $N(Me)_2$ group is eliminated. In the reaction using TDMAS and ozone, Si—O—Si coupling is increased as the supply time of ozone is increased, and if the Si—O—Si coupling is generated, the film growth thereafter may be hindered.

Figure 4:
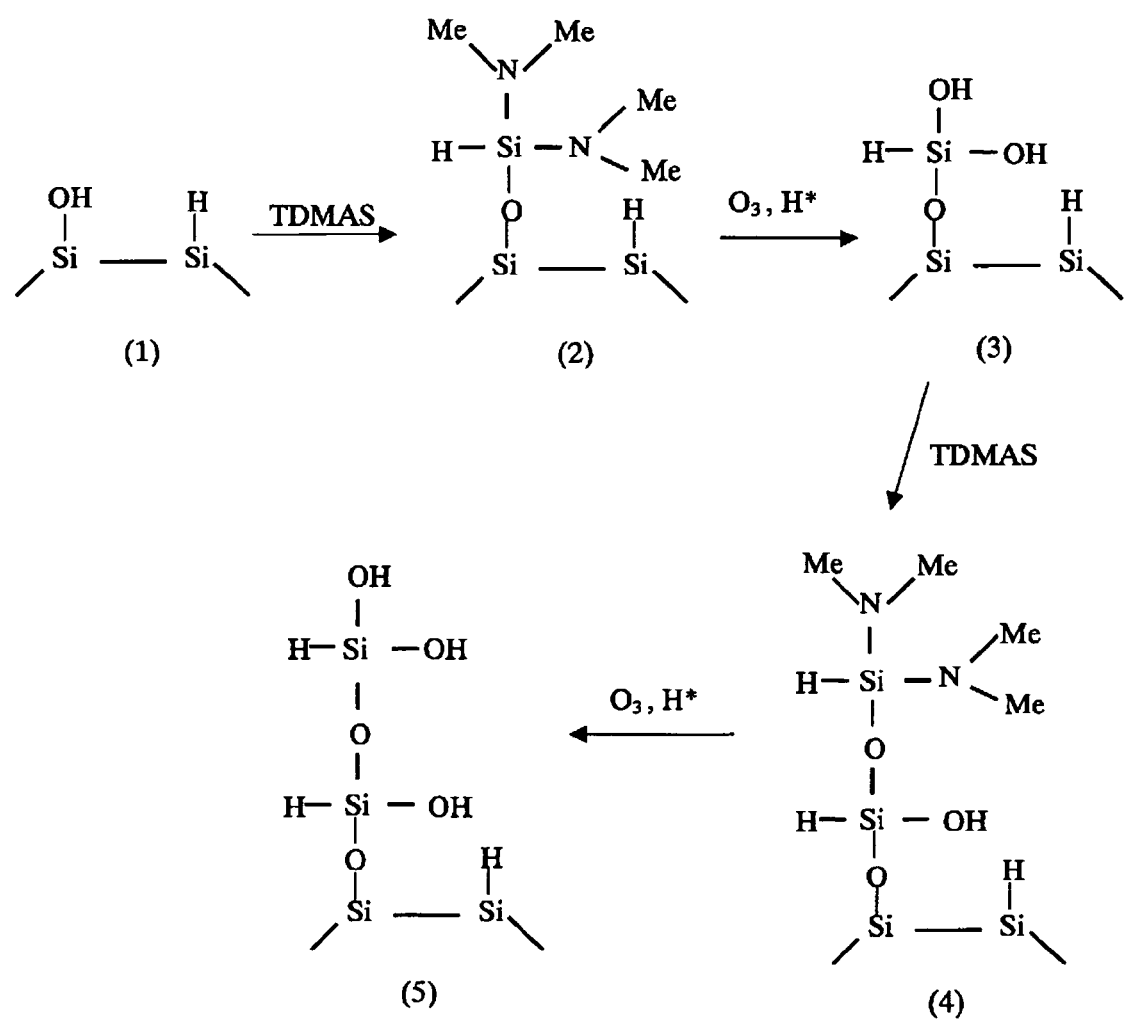
FIG. 4 is a schematic diagram for explaining a film formation mechanism.

Hence, the inventors achieve a method in which atomic hydrogen (hydrogen plasma) and ozone are alternately supplied into the reaction chamber to form a film instead of supplying $H_2O$ directly into the reaction chamber. FIG. 4 shows a film formation model using TDMAS, atomic hydrogen (hydrogen plasma) and ozone. The initial surface is Si—H and Si—OH as shown in the reaction using TDMAS and ozone. When TDMAS flows, the TDMAS is adsorbed and $N(Me)_2$ is eliminated as shown in (2) of FIG. 4. In a subsequent ozone supply step, $N(Me)_2$ groups are eliminated. Next, when atomic hydrogen (hydrogen plasma) is supplied, OH termination occurs as shown in step (3). When TDMAS is supplied again in a next step (4), the TDMAS is adsorbed on the OH-terminated portion and a $N(Me)_2$ group is eliminated.

As described above, since atomic hydrogen (hydrogen plasma) and ozone flow individually, $H_2O$ does not remain in the reaction chamber as compared with the conventional process using $H_2O$. Moreover, since a surface of a substrate can be OH-terminated as compared with ozone, there is an advantage that TDMAS can easily be adsorbed.

Next, a step of forming an oxide film on a surface of a wafer by the ALD method will be explained.

Figure 5:
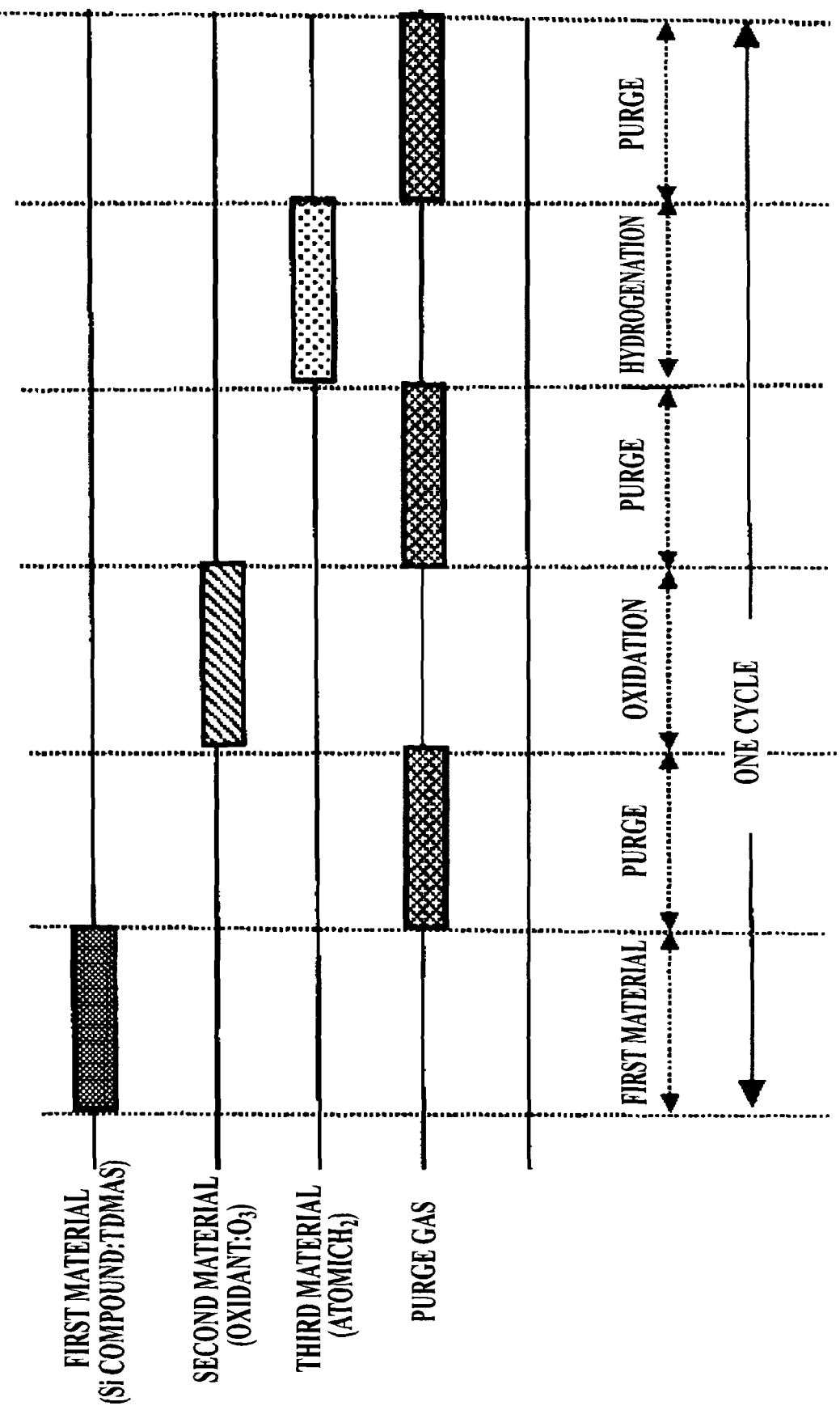
FIG. 5 is a schematic diagram for explaining a process sequence (embodiment) of an oxide film.

FIG. 5 shows a processing sequence according to the preferred embodiments of the present invention.

In a first step, TDMAS which is a metal organic compound material flows into the reaction chamber, and the TDMAS is adsorbed on a surface of a Si substrate. In a second step, a purge is carried out using an inert gas to exhaust the remaining Si material from the reaction chamber. In a third step, ozone which is a second material flows to eliminate a dimethylamine $N(Me)_2$ group of a first material gas TDMAS which is adsorbed on the substrate. In a fourth step, the reaction chamber is purged with an inert gas. In a fifth step, atomic hydrogen (hydrogen plasma) is supplied into the reaction chamber. Si—OH is substituted by the atomic hydrogen (hydrogen plasma) on the surface of the substrate. In a sixth step, the reaction chamber is purged with an inert gas. The first to sixth steps are repeated predetermined times. As a result, a silicon oxide film ($SiO_2$) is formed on the surface of the substrate.

In the above-described processing sequence (FIG. 5), the purge step after supplying the oxidant which is the second material may be omitted, and the oxidant which is the second material and the atomic hydrogen (hydrogen plasma) which is the third material may be interchanged.

In the above-described processing sequence (FIG. 5), it is possible to form not only the silicon oxide film, but also a metal oxide film made of one selected from the group consisting of $Al_2O_3$, $TiO_2$, $ZrO_2$, $HfO_2$, $Ta_2O_5$, $RuO_2$, $IrO_2$.

In this case, the first material to be used in the first step is one selected from the group consisting of organic compounds including an aluminum atom, a titanium atom, a zirconium atom, a hafnium atom, a tantalum atom, a ruthenium atom, an iridium atom and a silicon atom, and chlorides of the respective atoms. More preferably, the first material is $MH_n[OCR^1R^2R^3]_{m-n}$ or $MH_n[NR^4R^5]_{m-n}$. Here, M represents one of the above-described metals such as aluminum, m is a stable valence of the one of the metals, n is an integer of 0 to 2 (n is equal to 0 when M represents an atom other than silicon), and $R^1$ to $R^5$ represent hydrogen or an alkyl group which has a carbon number of 1 to 4 and which may have ether binding at an intermediate portion.

Instead of ozone ($O_3$), the second material to be used in the third step may be a material selected from hydrogen peroxide ($H_2O_2$), oxygen and atomic oxygen. Instead of hydrogen plasma, the third material to be used in the fifth step may be a material including desorbed hydrogen. Further, the inert gas to be used in the second, fourth and sixth steps is preferably helium (He), neon (Ne), argon (Ar) or nitrogen ($N_2$).

Further, in the forming step of the silicon oxide film or the metal oxide film, which is mainly constituted by steps 1 to 6, a temperature in the reaction chamber into which gas is supplied is preferably no lower than 20° C., nor higher than 700° C., and a pressure in the reaction chamber is preferably no lower than 1 Pa, nor higher than 10,000 Pa.

Figure 6:
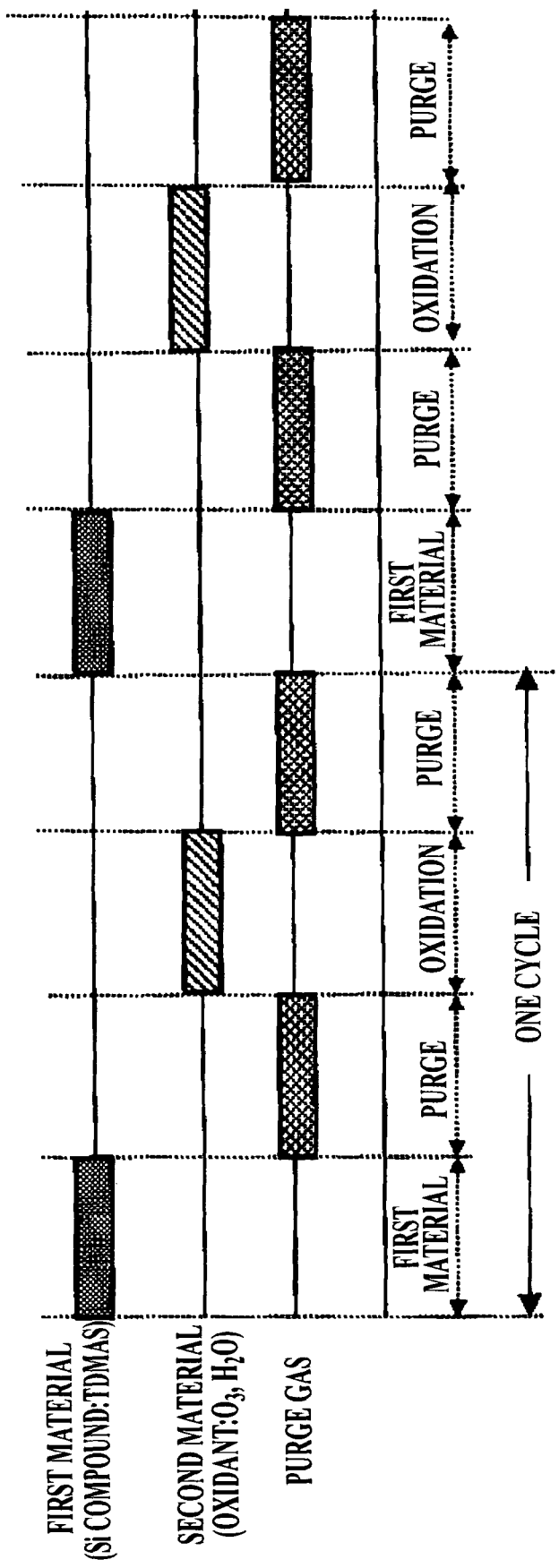
FIG. 6 is a schematic diagram for explaining a process sequence (comparative example) of an oxide film.

As a comparative example of the sequence shown in FIG. 5, FIG. 6 shows a $SiO_2$ film process sequence by the ALD method according to the film formation model shown in FIG. 3.

One cycle has four steps. In a first step, TDMAS which is a silicon compound material flows into the reaction chamber, and the material is adsorbed on a surface of a Si substrate. In a second step, a purge is carried out using an inert gas to exhaust the remaining Si material from the reaction chamber. In a third step, an oxidant flows, and the Si material adsorbed on the surface of the Si substrate reacts with $O_3$ to form $SiO_2$. In a fourth step, the reaction chamber is purged with an inert gas to exhaust the residual ozone from the reaction chamber. An example of time required for each of the steps is as follows: 1 to 30 seconds for the first step (Si material supply step); 5 to 15 seconds for the second step (purge step); 5 to 60 seconds for the third step ($O_3$ supply step); and 5 to 15 seconds for the fourth step (purge step).

Figure 7:
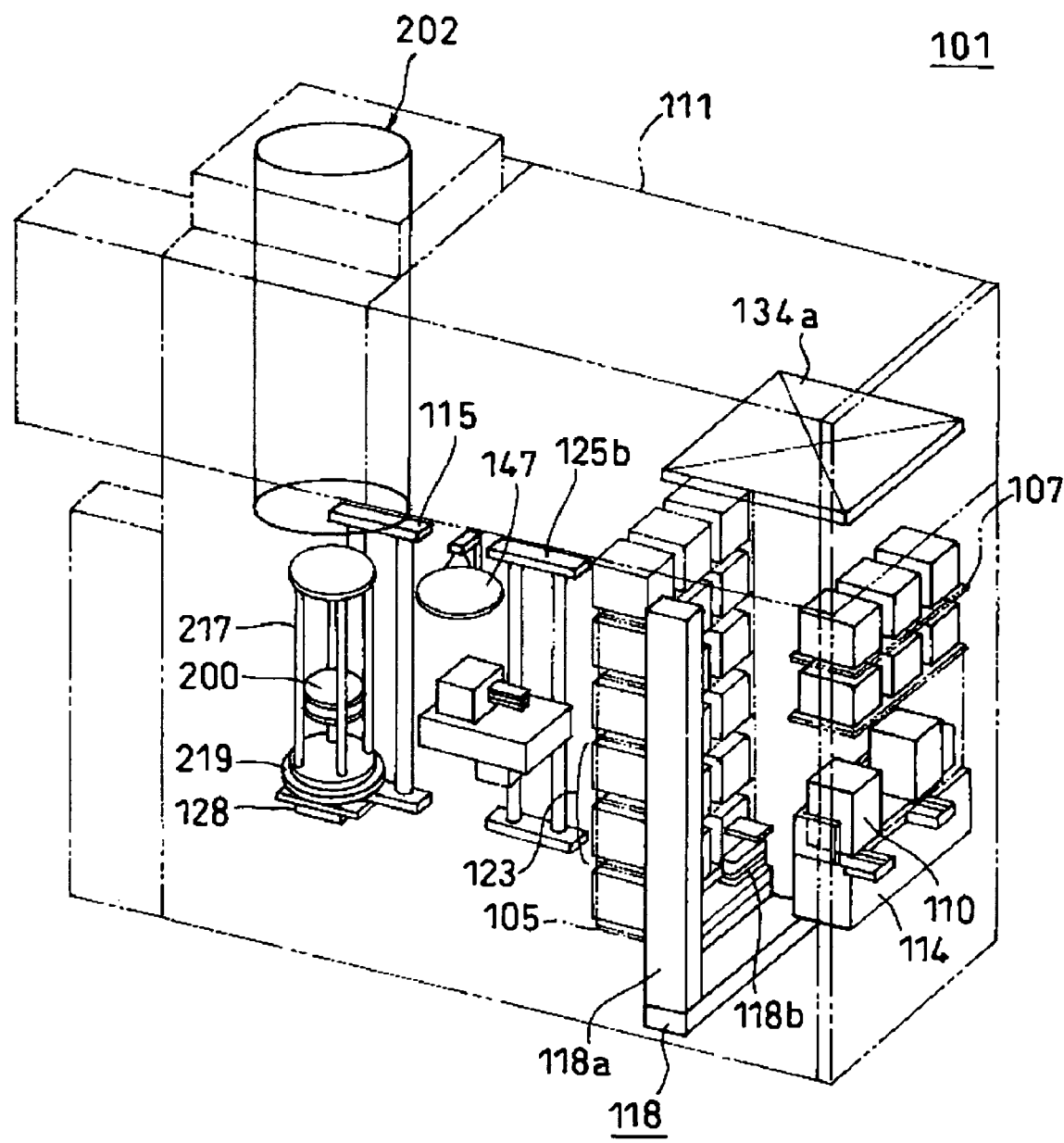
FIG. 7 is a schematic diagram of a substrate processing apparatus according to embodiments of the present invention.
Figure 8:
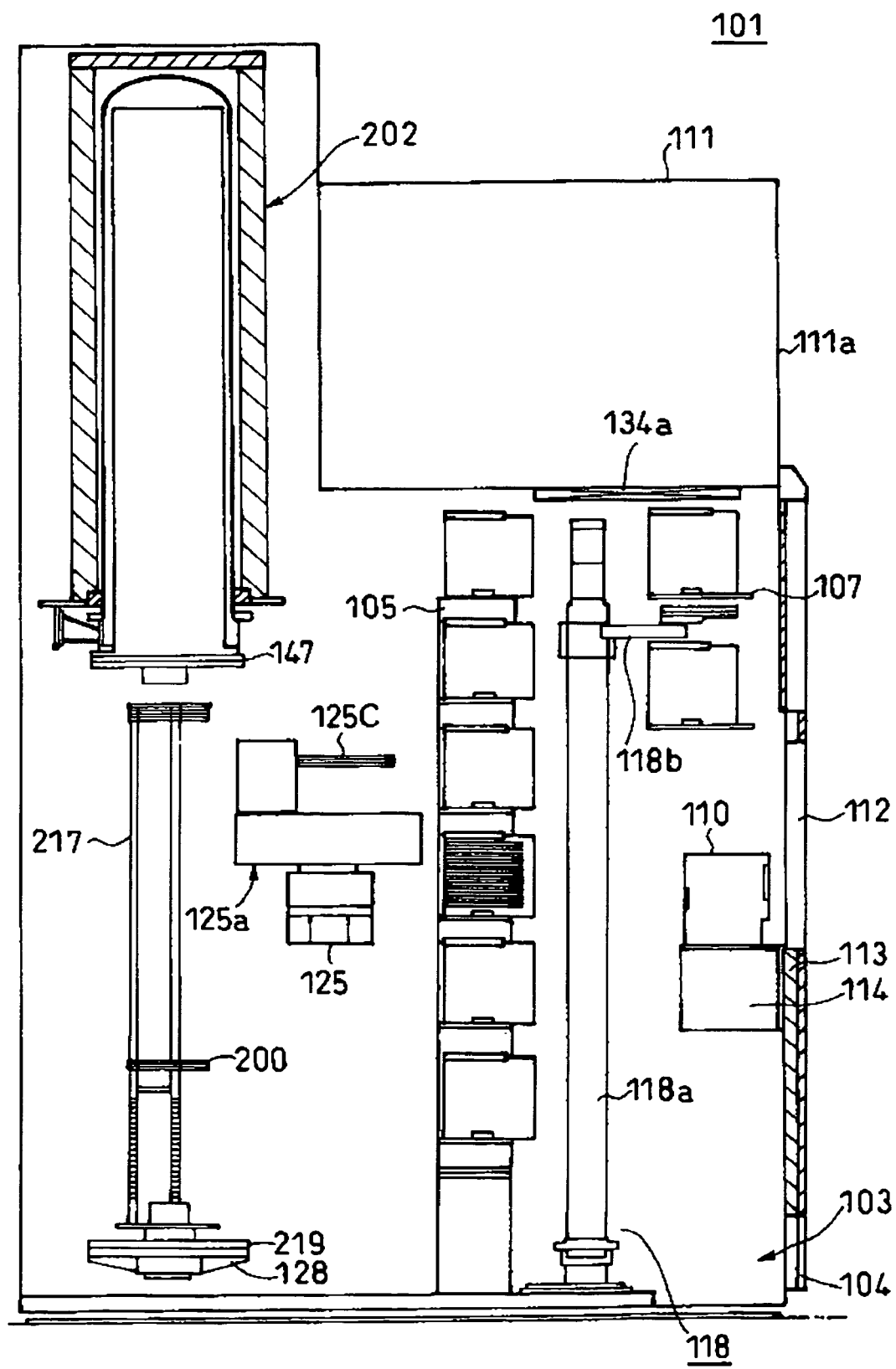
FIG. 8 is a sectional view of the substrate processing apparatus according to the embodiments.

Next, a semiconductor producing apparatus (simply, "processing apparatus" hereinafter) to be applied to a substrate processing system which carries out processing steps in a producing method of a semiconductor device will be explained with reference to FIGS. 7 and 8. FIG. 7 shows a perspective view of the processing apparatus to be used in the embodiments of the present invention. FIG. 8 is a side perspective view of the processing apparatus shown in FIG. 7.

As shown in FIGS. 7 and 8, a processing apparatus 101 of the preferred embodiment uses cassettes 110 as wafer carriers which accommodate wafers (substrates) 200 made of silicon. The processing apparatus 101 includes a casing 111 having a front wall 111a. A front maintenance opening 103 as an opening is formed at a lower portion of the front wall 111a so that maintenance can be carried out. A front maintenance door 104 is provided for opening and closing the front maintenance opening 103. A cassette carry in/out opening (a substrate container carry in/out opening) 112 is formed in the maintenance door 104 so that an inside and an outside of the casing 111 are in communication through the cassette carry in/out opening 112. The cassette carry in/out opening 112 is opened and closed by a front shutter (substrate container carry in/out opening open/close mechanism) 113. A cassette stage (a substrate container delivery stage) 114 is disposed at the cassette carry in/out opening 112 inside the casing 111. The cassette 110 is transferred onto the cassette stage 114 by a rail guided vehicle (not shown) and is carried out from the cassette stage 114.

The cassette 110 delivered by the rail guided vehicle is placed on the cassette stage 114 such that the wafers 200 in the cassette 110 are in their vertical attitudes and an opening of the cassette 110 for taking wafers in and out is directed upward. The cassette stage 114 is constituted such that it rotates the cassette 110 clockwise in the vertical direction by 90° to rearward of the casing, the wafers 200 in the cassette 110 are in their horizontal attitudes, and the opening of the cassette 110 for taking wafers in and out is directed to rearward of the casing.

Cassette shelves (substrate container placing shelves) 105 are disposed substantially at a central portion in the casing 111 in its longitudinal direction, and the cassette shelves 105 store a plurality of cassettes 110 in a plurality of rows and a plurality of lines. The cassette shelves 105 are provided with transfer shelves 123 in which the cassettes 110 to be transferred by a wafer loading mechanism 125 are to be accommodated. Auxiliary cassette shelves 107 are provided above the cassette stage 114 to subsidiarily store the cassettes 110.

A cassette transfer device (a substrate container transfer device) 118 is provided between the cassette stage 114 and the cassette shelves 105. The cassette transfer device 118 includes a cassette elevator (a substrate container elevator mechanism) 118a capable of vertically moving while holding the cassette 110, and a cassette transfer mechanism (a substrate container transfer mechanism) 118b as a transfer mechanism. The cassette transfer device 118 transfers the cassette 110 between the cassette stage 114, the cassette shelves 105 and the auxiliary cassette shelves 107 by a continuous motion of the cassette elevator 118a and the cassette transfer mechanism 118b.

A wafer loading mechanism (a substrate transfer mechanism) 125 is provided behind the cassette shelves 105. The wafer loading mechanism 125 includes a wafer loading device (a substrate loading device) 125a which can rotate or straightly move the wafer 200 in the horizontal direction, and a wafer loading device elevator (a substrate loading device elevator mechanism) 125b which vertically moves the wafer loading device 125a. The wafer loading device elevator 125b is provided on a right end of the pressure-proof casing 111. Tweezers (a substrate holding body) 125c of the wafer loading device 125a as a placing portion of the wafers 200 charges a boat (a substrate holding tool) 217 with wafers 200 and discharges the wafers 200 from the boat 217 by continuous motion of the wafer loading device elevator 125b and the wafer loading device 125a.

Figure 9:
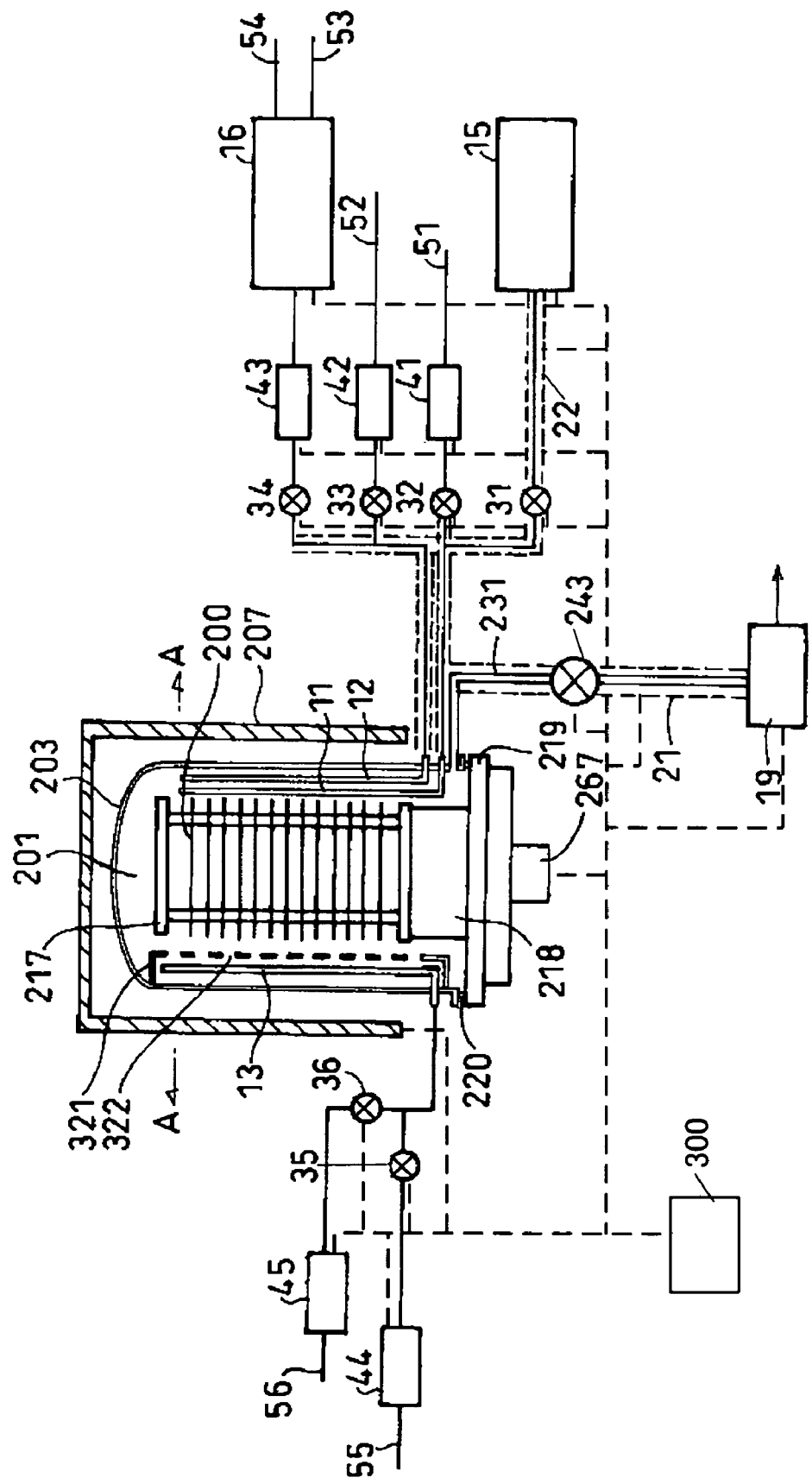
FIG. 9 is a configuration diagram of a processing furnace of the substrate processing apparatus according to the embodiments.

As shown in FIG. 9, a processing furnace 202 is provided at a rear upper portion in the casing 111. A lower end of the processing furnace 202 is opened and closed by a furnace opening shutter (a furnace opening open/close mechanism) 147.

A boat elevator (a substrate holding tool elevator mechanism) 115 is provided below the processing furnace 202 as an elevator mechanism for vertically moving the boat 217 to and from the processing furnace 202. A seal cap 219 as a lid is horizontally set up on an arm 128 as a connecting tool connected to an elevating stage of the boat elevator 115. The seal cap 219 vertically supports the boat 217, and can close a lower end of the processing furnace 202.

The boat 217 includes a plurality of holding members, and horizontally holds a plurality of wafers 200 (e.g., about 50 to 150 wafers) which are arranged in the vertical direction such that centers thereof are aligned with each other.

As shown in FIG. 8, a clean unit 134a is provided above the cassette shelves 105. The clean unit 134a includes a dustproof filter and a supply fan for supplying clean air which is a purified atmosphere so that the clean air flows into the casing 111.

A clean unit (not shown) having a supply fan for supplying clean air and a dustproof filter is provided on a left side of the casing 111, i.e. on the opposite side of the wafer loading device elevator 125b and the boat elevator 115. Clean air belched out from the clean unit (not shown) flows through the wafer loading device 125a and the boat 217, and then is sucked in by an exhaust device (not shown), and is exhausted outside the casing 111.

Next, an operation of the above-described processing apparatus will be explained.

As shown in FIGS. 7 and 8, before the cassette 110 is supplied to the cassette stage 114, the cassette carry in/out opening 112 is opened by the front shutter 113. Then, the cassette 110 is transferred in from the cassette carry in/out opening 112, and is placed on the cassette stage 114 such that the wafers 200 are in their vertical attitudes and the opening of the cassette 110 for taking wafers in and out is directed upward. Then, the cassette 110 is rotated clockwise in the vertical direction by 90° to rearward of the casing so that the wafers 200 in the cassette 110 are in their horizontal attitudes, and the opening of the cassette 110 for taking wafers in and out is directed to rearward of the casing.

Next, the cassette 110 is automatically transferred onto a designated shelf position of the cassette shelves 105 or the auxiliary cassette shelves 107 by the cassette transfer device 118, and the cassette 110 is temporarily stored. After that, the cassette 110 is transferred onto the transfer shelves 123 from the cassette shelves 105 or the auxiliary cassette shelves 107 by the cassette transfer device 118, or directly transferred onto the transfer shelves 123.

When the cassette 110 is transferred onto the transfer shelves 123, the wafers 200 are picked up from the cassette 110 through the opening by tweezers 125c of the wafer loading device 125a, and the boat 217 located behind a loading chamber 124 is charged with the wafers 200. The wafer loading device 125a which delivered the wafers 200 to the boat 217 returns to the cassette 110, and charges the boat 217 with the next wafers 200.

When the boat 217 is charged with a predetermined number of wafers 200, a lower end of the processing furnace 202 which was closed by the furnace opening shutter 147 is opened by the furnace opening shutter 147. Then, the boat 217 which holds a group of wafers 200 is loaded into the processing furnace 202 by moving the seal cap 219 upward by the boat elevator 115. After the loading, the wafers 200 are subjected to arbitrary processing in the processing furnace 202. After the processing, the wafers 200 and the cassette 110 are carried outside the casing 111 by reversing the above-described procedure.

Figure 10:
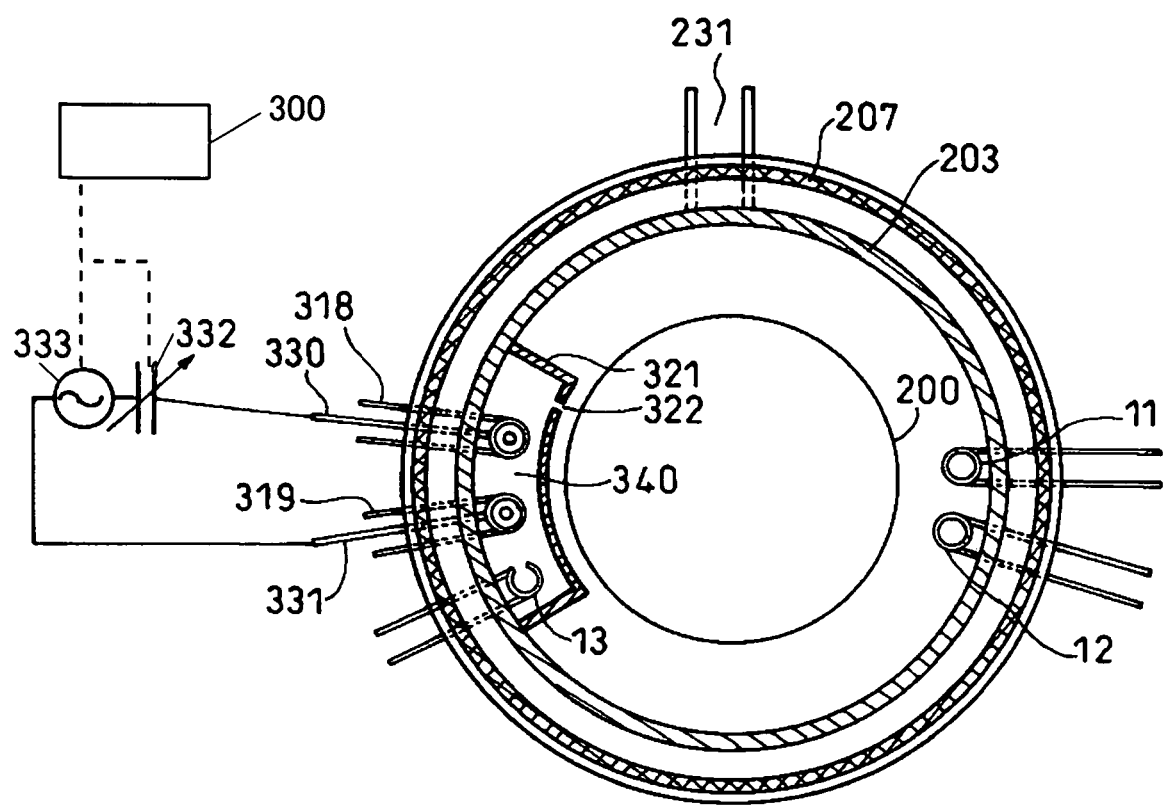
FIG. 10 is a sectional view of the processing furnace of the substrate processing apparatus according to the embodiments.

Next, the processing furnace 202 applied to the above-described substrate processing apparatus will be explained with reference to FIGS. 9 and 10.

FIG. 9 is a schematic block diagram of a vertical substrate processing furnace which is preferably used in the preferred embodiments of the present invention, and shows a vertical sectional view of a portion of the processing furnace 202. FIG. 10 shows a sectional view of a portion of the processing furnace 202 taken along the line A-A.

A reaction tube 203 as a reaction container which processes the wafers 200 as substrates is provided inside a heater 207 which is a heating device (heating means). A manifold 209, which is made of stainless steal etc., is provided at a lower end of the reaction tube 203 through an O-ring 220 which is an air-tight member. A lower end opening of the manifold 209 is air-tightly closed by the seal cap 219 as a lid through an O-ring 220. The processing chamber 201 is formed by at least the reaction tube 203, the manifold 209 and the seal cap 219. The boat 217 which is the substrate holding member (substrate holding means) stands on the seal cap 219 through a boat support stage 218. The boat support stage 218 is a holding body which holds the boat. The boat 217 is inserted into the processing chamber 201. The plurality of wafers 200 which are to be subjected to batch process are stacked on the boat 217 in a horizontal attitude in multi-layers in the axial direction of the tube. The heater 207 heats the wafers 200 inserted into the processing chamber 201 to a predetermined temperature.

There are provided three gas supply paths (a first gas supply path, a second gas supply path and a third gas supply path) as supply paths through which a plurality of kinds (here, four kinds) of processing gases are supplied into the processing chamber 201. The first gas supply path is provided with a material supply unit (including a liquid material tank, a liquid flow rate control device and a liquid material vaporizer) 15 which supplies TDMAS and a first valve 31 which is an on-off valve in this order from upstream. A first carrier gas supply tube 51 which supplies a carrier gas merges into the first gas supply path. A TDMAS supply tube of the first gas supply path is covered with a heater 22 so that the TDMAS supply tube can be heated. The carrier gas supply tube 51 is provided with a mass flow controller 41 which is a flow rate control device (flow rate control means) and a valve 32 which is an on-off valve in this order from upstream. A first nozzle 11 is provided at a tip end of the first gas supply path in an arc space between the wafers 200 and an inner wall of the reaction tube 203 constituting the processing chamber 201 along a stacking direction of the wafers 200 from a lower portion to an upper portion of the inner wall of the reaction tube 203. First gas supply holes through which gas is supplied are formed at a side of the first nozzle 11 so that a material can be supplied onto the wafers. The first gas supply holes have the same opening areas and the same opening pitches along from the lower portion to the upper portion.

A material supply unit 16 for supplying ozone, an oxygen supply tube 53 for supplying oxygen to generate ozone in the supply unit 16, and a nitrogen supply tube 54 for supplying nitrogen as a purge gas are connected to the second gas supply path. The second gas supply path is provided with a mass flow controller 43 which controls a flow rate of a material and a valve 34 which is an on-off valve in this order from upstream. A carrier gas supply tube 52 which supplies a carrier gas merges into the second gas supply path. The carrier gas supply tube 52 is provided with a mass flow controller 42 which is a flow rate control device (flow rate control means) and a valve 33 which is an on-off valve in this order from upstream. A second nozzle 12 is provided at a tip end of the second gas supply path in an arc space between the wafers 200 and the inner wall of the reaction tube 203 constituting the processing chamber 201 along a stacking direction of the wafers 200 from a lower portion to an upper portion of the inner wall of the reaction tube 203. Second gas supply holes through which gas is supplied are formed at a side of the second nozzle 12.

The third gas supply path is provided with a material supply tube 55 for supplying hydrogen, a mass flow controller 44 which is a flow rate control device (flow rate control means)

of this material and a valve 35 which is an on-off valve in this order from upstream. A carrier gas supply tube 56 which supplies a carrier gas merges into the third gas supply path through a mass flow controller 45 which controls a flow rate of a purge gas and a valve 36 which is an on-off valve. A third nozzle 13 is provided at a tip end of the third gas supply path in an arc space between the wafers 200 and the inner wall of the reaction tube 203 constituting the processing chamber 201 along a stacking direction of the wafers 200 from a lower portion to an upper portion of the inner wall of the reaction tube 203. Electrodes 330 and 331 for generating plasma and the third nozzle 13 are provided in a buffer chamber 321. Supply holes through which gas is supplied are formed at a side of the third nozzle 13 so that hydrogen as a material is supplied into the buffer chamber. The electrodes 330 and 331 are connected to a high frequency power source 333 and a tuner device 332 to generate plasma in the buffer chamber. In the buffer chamber, the electrodes 330 and 331 are covered with protection tubes 318 and 319 to prevent contamination from the electrodes. Atomic hydrogen (hydrogen plasma) generated in the buffer chamber 321 is supplied into the processing chamber 201 through buffer chamber gas supply holes 322.

The processing chamber 201 is connected to a vacuum pump 19 which is an exhaust device (exhaust means) through a valve 243 by means of a gas exhaust pipe 231 for exhausting gas so that the processing chamber 201 can be evacuated. The valve 243 is an on-off valve which can be opened and closed so that the processing chamber 201 can be evacuated and the evacuation can be stopped. If the opening of the valve 243 is adjusted, a pressure in the processing chamber 201 can be adjusted. The gas exhaust pipe 231 is covered with a heater 21 so that the gas exhaust pipe 231 can be heated.

The boat 217 is provided at a central portion in the reaction tube 203. A plurality of wafers 200 are placed on the boat 217 at a constant distance from one another in multi-layers. The boat 217 can be loaded into and unloaded from the reaction tube 203 by a boat elevator mechanism (not shown). A boat rotation mechanism 267 for rotating the boat 217 is provided to enhance the uniformity of the processing. The boat 217 supported by a boat support stage 218 is rotated by driving the boat rotation mechanism 267.

The substrate processing apparatus is provided with a controller 300 which is one example of a control section (control means). The controller 300 is connected to the material supply units 15 and 16, the heaters 21 and 22, the mass flow controllers 41, 42, 43, 44 and 45, the valves 31, 32, 33, 34, 35, 36 and 243, the heater 207, the vacuum pump 19, the boat rotation mechanism 267, the boat elevator 115, the high frequency power source 333, the tuner device 332 and the like. The controller 300 controls operations of the material supply units 15 and 16, temperature adjustment of the heaters 21 and 22, flow rate adjustment of the mass flow controllers 41, 42, 43, 44 and 45, opening and closing of the valves 31, 32, 33, 34, 35, 36 and 243, pressure adjustment, temperature adjustment of the heater 207, start and stop of the vacuum pump 19, rotation speed adjustment of the boat rotation mechanism 267, vertical motion of the boat elevator 115, operation of the high frequency power source 333, operation of the tuner device 332 and the like.

Next, an example of a film forming processing using the processing furnace 202 will be explained.

In the processing furnace 202 of the embodiments, a silicon oxide film such as $SiO_2$ or a metal oxide film such as $HfO_2$ is formed. Examples of the silicon oxide film or the metal oxide film include an amino-based material such as TDMAS (tris (dimethylamino) silane, $SiH(NMe_2)_3$) for $SiO_2$, and TEMAH (tetrakis (methylethylamino) hafnium, $Hf(NEtMe)_4$) and TDEAH (tetrakis (diethylamino) hafnium, $Hf(NEt_2)_4$) for $HfO_2$. Here, Me represents a methyl group ($CH_3$), and Et represents an ethyl group ($C_2H_5$). As a metal compound, it is possible to use a material selected from the group consisting of organic compounds including an aluminum atom, a titanium atom, a zirconium atom, a hafnium atom, a tantalum atom, a ruthenium atom and an iridium atom, and chlorides of the respective atoms.

As an example of a film forming processing using the ALD method, a film forming of $SiO_2$, which is one of producing steps of a semiconductor device, using TDMAS, ozone and atomic hydrogen will be explained.

According to the ALD (Atomic Layer Deposition) method, a plurality of kinds of reaction gases which are materials used for film formation are alternately supplied onto substrates one kind by one kind under given film forming conditions (temperature, time, etc.), the gases are adsorbed onto the substrates on an atom-layer basis, and films are formed utilizing surface reaction. At that time, the film thickness is controlled by the number of cycles of supply of the reaction gases (if a film forming speed is 1 Å/cycle, in order to form a film of 20 Å, 20 cycles are carried out).

If a $SiO_2$ film is formed by the ALD method, a high quality film can be formed at low temperature (about 200 to 600° C.).

First, the boat 217 is charged with wafers 200 as described above and is loaded into the processing chamber 201. After the boat 217 is loaded into the processing chamber 201, the following steps will be sequentially executed.

(Step 1)

The valve 243 is opened to evacuate the processing chamber and then, the valve 31 is opened to supply a first gas into the processing chamber. Since TDMAS which is the first gas is a liquid material, the TDMAS is vaporized and a flow rate thereof is controlled in the liquid material supply unit 15. The material is supplied into the processing chamber with the valve 31 open for a given time so that the first material is adsorbed on the substrates. During that time, a pressure in the processing chamber 201 is maintained in a range of 1 to 10000 Pa, preferably in a range of 26 to 266 Pa, and is maintained at 66 Pa for example. After that, the valve 31 is closed.

(Step 2)

Then, a carrier gas flows from the carrier gas supply tube 51 to exhaust (purge) the first material from the processing chamber. A flow rate of the carrier gas is adjusted by the mass flow controller 41. During that time, the pressure in the processing chamber 201 is maintained in a range of 1 to 10000 Pa, preferably in a range of 26 to 266 Pa, and is maintained at 66 Pa for example.

(Step 3)

The valve 34 is opened to supply a second gas into the processing chamber. A flow rate of ozone which is the second gas is controlled by the ozone supply unit 16. The material is supplied into the processing chamber with the valve 34 open for a given time. During that time, the pressure in the processing chamber 201 is maintained in a range of 1 to 10000 Pa, preferably in a range of 26 to 266 Pa, and is maintained at 66 Pa for example. After that, the valve 34 is closed.

(Step 4)

Then, a carrier gas flows from the carrier gas supply tube 52 to exhaust (purge) the second material from the processing chamber. A flow rate of the carrier gas is adjusted by the mass flow controller 42. During that time, the pressure in the processing chamber 201 is maintained in a range of 1 to 10000 Pa, preferably in a range of 26 to 266 Pa, and is maintained at 66 Pa for example.

(Step 5)

The valve 35 is opened to supply a third gas into the reaction chamber. Atomic hydrogen (hydrogen plasma) is generated by the electrodes provided in the buffer chamber from hydrogen which is the third gas. At that time, frequency of 13.56 MHz is generally used as high frequency applied to the electrodes. A flow rate of hydrogen is controlled by the mass flow controller 44. The third material is supplied into the reaction chamber with the valve 35 open for a given time. During that time, the pressure in the processing chamber 201 is maintained in a range of 1 to 10000 Pa, preferably in a range of 26 to 266 Pa, and is maintained at 66 Pa for example. After that, the valve 35 is closed.

(Step 6)

Then, a carrier gas flows from the carrier gas supply tube 56 to exhaust (purge) the third material from the reaction chamber. A flow rate of the carrier gas is adjusted by the mass flow controller 45. During that time, the pressure in the processing chamber 201 is in a range of 1 to 10000 Pa, preferably in a range of 26 to 266 Pa, and is maintained at 66 Pa for example.

The steps 1 to 6 are repeated until a film having a desired thickness is formed and then, the processing chamber 201 is evacuated to exhaust the material gas. After that, the pressure in the processing chamber 201 is returned to an atmospheric pressure by a purge gas. After each of the steps 2, 4 and 6, and after a film having the desired thickness is formed, an inert gas is used. Preferably, helium (He), neon (Ne), argon (Ar) or nitrogen ($N_2$) is used as the inert gas. When the pressure in the processing chamber 201 is returned to the atmospheric pressure, the boat 217 is unloaded from the processing chamber 201.

As described above, a plurality of processing substrates are stacked in multi-layers in the reaction chamber, and an oxide film is formed by the ALD (Atomic Layer Deposition) method in which the first material (a metal compound material) is supplied and then, the second material (an oxide material) is supplied and then, the third material (a hydrogen material) is supplied. The first material, the second material and the third material are alternately supplied. With this, adsorption of the metal compound material is facilitated, and a metal oxide film having excellent surface flatness and step coverage can be obtained.

In the above-described film forming processing, the purge step in step 4 may be omitted, and the steps 3 and 5 may be interchanged.

The $SiO_2$ film formation is explained in the above-described embodiments. It is possible to form not only the $SiO_2$ film, but also a metal oxide film made of one selected from the group consisting of $Al_2O_3$, $TiO_2$, $ZrO_2$, $HfO_2$, $Ta_2O_5$, $RuO_2$ and $IrO_2$.

In this case, a material to be supplied into the processing chamber 201 in the step 1 is preferably one material selected from the group consisting of organic compounds including an aluminum atom, a titanium atom, a zirconium atom, a hafnium atom, a tantalum atom, a ruthenium atom, an iridium atom, and chlorides of the above-described atoms. More preferably, the material is $MH_n[OCR^1R^2R^3]_{m-n}$ or $MH_n[NR^4R^5]_{m-n}$. Here, M represents one of the above-described metals such as aluminum, m is a stable valence of the one of the metals; n is an integer of 0 to 2 (n is equal to 0 when M is an atom other than silicon); and $R^1$ to $R^5$ represent hydrogen or an alkyl group which has a carbon number of 1 to 4 and which may have ether binding at an intermediate portion.

Instead of ozone ($O_3$), a material to be supplied into the processing chamber 201 in the step 3 may be one material selected from the group consisting of hydrogen peroxide ($H_2O_2$), oxygen and atomic oxygen. Instead of hydrogen plasma, a material to be supplied into the processing chamber 201 in the step 5 may be a material including desorbed hydrogen.

In the forming step of the silicon oxide film or the metal oxide film, which is mainly constituted by steps 1 to 6, a temperature in the processing chamber 201 into which gas is supplied is preferably no lower than 20° C., nor higher than 700° C., and a pressure in the processing chamber 201 is preferably no lower than 1 Pa, nor higher than 10,000 Pa.

As explained above, according to the preferred embodiments of the present invention, there is provided a producing method of a semiconductor device including: loading at least one substrate into a processing chamber; forming a metal oxide film or a silicon oxide film on a surface of the substrate by repeatedly supplying a metal compound or a silicon compound, each of which is a first material, an oxide material which is a second material including an oxygen atom, and a hydride material which is a third material, into the processing chamber predetermined times; and unloading the substrate from the processing chamber.

Preferably, an OH-group is substituted for a reaction site on the surface of the substrate by supplying the second material and the third material into the processing chamber.

Preferably, in the forming the metal oxide film or the silicon oxide film, the processing chamber is purged with an inert gas whenever each of the first material, the second material and the third material is supplied into the processing chamber.

Preferably, in the forming the metal oxide film or the silicon oxide film, the processing chamber is purged with a purge gas whenever each of the first material and the third material is supplied into the processing chamber, and the processing chamber is not purged with the purge gas whenever the second material is supplied into the processing chamber.

Preferably, in the forming the metal oxide film or the silicon oxide film, the first to third materials are supplied into the processing chamber in the order of the first material, the second material and the third material.

Preferably, in the forming the metal oxide film or the silicon oxide film, the first to third materials are supplied into the processing chamber in the order of the first material, the third material and the second material.

Preferably, the metal oxide film or the silicon oxide film is a film made of one selected from the group consisting of $Al_2O_3$, $TiO_2$, $ZrO_2$, $HfO_2$, $Ta_2O_5$, $RuO_2$, $IrO_2$ and $SiO_2$.

Preferably, the first material as the metal compound or the silicon compound is one material selected from the group consisting of organic compounds including an aluminum atom, a titanium atom, a zirconium atom, a hafnium atom, a tantalum atom, a ruthenium atom, an iridium atom and a silicon atom, and chlorides of the respective atoms.

More preferably, the first material is $MH_n[OCR^1R^2R^3]_{m-n}$ or $MH_n[NR^4R^5]_{m-n}$.

M represents one of metals described in claim 8, m is a stable valence of the one of the metals; n is an integer of 0 to 2 (n is equal to 0 when M is an atom other than silicon); and $R^1$ to $R^5$ represent hydrogen or an alkyl group which has a carbon number of 1 to 4 and which may have ether binding at an intermediate portion.

Preferably, the second material is a material selected from the group consisting of ozone ($O_3$), hydrogen peroxide ($H_2O_2$), oxygen and atomic oxygen.

Preferably, the third material is a material selected from the group consisting of hydrogen plasma and a material including desorbed hydrogen.

Preferably, helium (He), neon (Ne), argon (Ar) and nitrogen ($N_2$) are used as the inert gas.

Preferably, in the forming the metal oxide film or the silicon oxide film, a temperature in the processing chamber is no lower than 20° C., nor higher than 700° C.

Preferably, in the forming the metal oxide film or the silicon oxide film, a pressure in the processing chamber is no lower than 1 Pa, nor higher than 10,000 Pa.

According to another preferred embodiments of the present invention, there is provided a substrate processing apparatus including: a processing chamber to process at least one substrate; a first supply system to supply the processing chamber with a metal compound or a silicon compound, each of which is a first material; a second supply system to supply the processing chamber with an oxide material which is a second material including an oxygen atom; a third supply system to supply the processing chamber with a hydride material which is a third material; an exhaust system to exhaust an atmosphere in the processing chamber; and a control section to control the first supply system, the second supply system and the third supply system so that the first material, the second material and the third material are repeatedly supplied into the processing chamber predetermined times.

The entire disclosures of Japanese Patent Application No. 2006-198753 filed on Jul. 20, 2006 including specification, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

As described above, according to the preferred embodiments of the present invention, it is possible to provide a film forming method of a metal oxide, a producing method of a semiconductor device and a substrate processing apparatus in which the above-described problems of the step coverage and the loading effect in film forming of a metal oxide are solved, a metal compound is adsorbed on a wafer (step) surface at a low temperature in a short time, surface flatness and the step coverage (recess embedding properties) are excellent and there is no loading effect.

As a result, the present invention can suitably be utilized for a technique for forming an oxide film on a semiconductor wafer by an ALD method in a producing method of a semiconductor integrated circuit.

The invention claimed is:

1. A producing method of a semiconductor device comprising the steps of:
   loading at least one substrate into a processing chamber comprising a buffer chamber and electrodes for generating hydrogen plasma, the electrodes being disposed in the buffer chamber and the buffer chamber having holes for supplying hydrogen plasma to the processing chamber;
   forming a metal oxide film or a silicon oxide film on a surface of the substrate by repeatedly supplying a metal compound or a silicon compound, each of which is a first material, an oxide material which is a second material including an oxygen atom, and the hydrogen plasma which is a third material, into the processing chamber predetermined times; and
   unloading the substrate from the processing chamber, wherein
   a hydrogen gas is supplied to the buffer chamber so that the plasma hydrogen is generated with the electrodes therein and supplied through the holes to the processing chamber to form the metal oxide film or the silicon oxide film on the surface of the substrate, and
   an OH-group is substituted for a reaction site on the surface of the substrate by supplying the second material and the third material into the processing chamber.

2. The producing method of the semiconductor device according to claim 1, wherein
   in the forming the metal oxide film or the silicon oxide film, the processing chamber is purged with an inert gas whenever each of the first material, the second material and the third material is supplied into the processing chamber.

3. The producing method of the semiconductor device according to claim 2, wherein
   the inert gas comprises a gas selected from the group consisting of helium, neon, argon and nitrogen.

4. The producing method of the semiconductor device according to claim 1, wherein
   in the forming the metal oxide film or the silicon oxide film, the processing chamber is purged with a purge gas whenever each of the first material and the third material is supplied into the processing chamber, and
   the processing chamber is not purged with the purge gas whenever the second material is supplied into the processing chamber.

5. The producing method of the semiconductor device according to claim 1, wherein
   in the forming the metal oxide film or the silicon oxide film, the first to third materials are supplied into the processing chamber in the order of the first material, the third material and the second material.

6. The producing method of the semiconductor device according to claim 1, wherein
   the metal oxide film or the silicon oxide film is a film made of one selected from the group consisting of $Al_2O_3$, $TiO_2$, $ZrO_2$, $HfO_2$, $Ta_2O_5$, $RuO_2$, $IrO_2$ and $SiO_2$.

7. The producing method of the semiconductor device according to claim 1, wherein
   the first material as the metal compound or the silicon compound is one material selected from the group consisting of organic compounds including an aluminum atom, a titanium atom, a zirconium atom, a hafnium atom, a tantalum atom, a ruthenium atom, an iridium atom and a silicon atom, and chlorides of the respective atoms.

8. The producing method of the semiconductor device according to claim 7, wherein
   the first material is $MH_n[OCR^1R^2R^3]_{m-n}$ or $MH_n[NR^4R^5]_{m-n}$ (wherein M represents one of metals described in claim 7, m is a stable valence of the one of the metals; n is an integer of 0 to 2 (n is equal to 0 when M is an atom other than silicon); and $R^1$ to $R^5$ represent hydrogen or an alkyl group which has a carbon number of 1 to 4 and which may have ether binding at an intermediate portion).

9. The producing method of the semiconductor device according to claim 1, wherein
   the second material is a material selected from the group consisting of ozone, hydrogen peroxide, oxygen and atomic oxygen.

10. The producing method of the semiconductor device according to claim 1, wherein
    in the forming the metal oxide film or the silicon oxide film, a temperature in the processing chamber is no lower than 20° C., nor higher than 700° C.

11. The producing method of the semiconductor device according to claim 1, wherein in the forming the metal oxide film or the silicon oxide film, a pressure in the processing chamber is no lower than 1 Pa, nor higher than 10,000 Pa.

12. The producing method of the semiconductor device according to claim 1, wherein,
a plurality of substrates are stacked and loaded into the processing chamber,
the holes for supplying the hydrogen plasma to the processing chamber are disposed along a stacking direction of the substrates,
the hydrogen gas is supplied to the buffer chamber so that the plasma hydrogen is generated with the electrodes therein and supplied along the stacked substrates through the holes to form the metal oxide film or the silicon oxide film on the surface of the substrate.

13. A producing method of a semiconductor device comprising the steps of:
loading at least one substrate into a processing chamber comprising a buffer chamber and electrodes for generating hydrogen plasma, the electrodes being disposed in the buffer chamber and the buffer chamber having holes for supplying hydrogen plasma to the processing chamber;
forming a metal oxide film or a silicon oxide film on a surface of the substrate by repeatedly supplying a metal compound or a silicon compound, each of which is a first material, an oxide material which is a second material including an oxygen atom, and the hydrogen plasma which is a third material, into the processing chamber predetermined times; and
unloading the substrate from the processing chamber, wherein
a hydrogen gas is supplied to the buffer chamber so that the plasma hydrogen is generated with the electrodes therein and supplied through the holes to the processing chamber to form the metal oxide film or the silicon oxide film on the surface of the substrate, wherein
in the forming the metal oxide film or the silicon oxide film, the first to third materials are supplied into the processing chamber in the order of the first material, the second material and the third material.

14. The producing method of the semiconductor device according to claim 13, wherein
in the forming the metal oxide film or the silicon oxide film, the processing chamber is purged with an inert gas whenever each of the first material, the second material and the third material is supplied into the processing chamber.

15. The producing method of the semiconductor device according to claim 14, wherein
the inert gas comprises a gas selected from the group consisting of helium, neon, argon and nitrogen.

16. The producing method of the semiconductor device according to claim 13, wherein
in the forming the metal oxide film or the silicon oxide film, the processing chamber is purged with a purge gas whenever each of the first material and the third material is supplied into the processing chamber, and
the processing chamber is not purged with the purge gas whenever the second material is supplied into the processing chamber.

17. The producing method of the semiconductor device according to claim 13, wherein
the metal oxide film or the silicon oxide film is a film made of one selected from the group consisting of $Al_2O_3$, $TiO_2$, $ZrO_2$, $HfO_2$, $Ta_2O_5$, $RuO_2$, $IrO_2$ and $SiO_2$.

18. The producing method of the semiconductor device according to claim 13, wherein
the first material as the metal compound or the silicon compound is one material selected from the group consisting of organic compounds including an aluminum atom, a titanium atom, a zirconium atom, a hafnium atom, a tantalum atom, a ruthenium atom, an iridium atom and a silicon atom, and chlorides of the respective atoms.

19. The producing method of the semiconductor device according to claim 18, wherein the first material is $MH_n[OCR^1R^2R^3]_{m-n}$ or $MH_n[NR^4R^5]_{m-n}$, in which:
M represents one of metals described in claim 18;
m is a stable valence of the one of the metals;
n is an integer of 0 to 2, provided that n is equal to 0 when M is an atom other than silicon; and
$R^1$ to $R^5$ represent hydrogen or an alkyl group which has a carbon number of 1 to 4 and which may have ether binding at an intermediate portion.

20. The producing method of the semiconductor device according to claim 13, wherein
the second material is a material selected from the group consisting of ozone, hydrogen peroxide, oxygen and atomic oxygen.

21. The producing method of the semiconductor device according to claim 13, wherein
in the forming the metal oxide film or the silicon oxide film, a temperature in the processing chamber is no lower than 20° C., nor higher than 700° C.

22. The producing method of the semiconductor device according to claim 13, wherein
in the forming the metal oxide film or the silicon oxide film, a pressure in the processing chamber is no lower than 1 Pa, nor higher than 10,000 Pa.

23. The producing method of the semiconductor device according to claim 13, wherein,
a plurality of substrates are stacked and loaded into the processing chamber,
the holes for supplying the hydrogen plasma to the processing chamber are disposed along a stacking direction of the substrates,
the hydrogen gas is supplied to the buffer chamber so that the plasma hydrogen is generated with the electrodes therein and supplied along the stacked substrates through the holes to form the metal oxide film or the silicon oxide film on the surface of the substrate.

* * * * *